Nov. 3, 1964 E. S. EICHERT ETAL 3,155,766

ELECTRICAL COMPONENT ASSEMBLAGE AND CASING THEREFOR

Filed Feb. 14, 1961

*INVENTORS*
Edwin S. Eichert
BY Robert F. Procter
Julius Polsky
S. C. Yuter
ATTORNEY 3,155,766

ELECTRICAL COMPONENT ASSEMBLAGE AND CASING THEREFOR

Edwin S. Eichert, Bryn Mawr, Robert F. Procter, Bristol, and Julius Polsky, Philadelphia, Pa., assignors to Technitrol, Inc., a corporation of Pennsylvania Filed Feb. 14, 1961, Ser. No. 89,156
14 Claims. (Cl. 174—52)

This invention relates to electrical component assemblages, to casings for electrical components, and to methods for making the casings and assembling the casing and electrical component and of physically integrating the assemblage in an electric circuit.

Prior art component casings of the general character contemplated by the present invention have a number of shortcomings and disadvantages, the overcoming of which is a general object of the present invention. One prior art casing structure includes a plurality of building-block type members that must be assembled in piece-meal fashion to allow for insertion of the component, soldering its leads to the terminals of the casing, and other manipulative steps affecting the component, and finally closing the casing by means of a cover that is secured together with the other members of the assembly by means of mechanical fasteners, as for example screws. Special assembly jigs are necessary for such operation, and the assembly is time-consuming.

Another shortcoming of prior art component casings resides in the requirement for different casing structures for use in mounting on terminal boards and printed circuit boards. In connection with the latter use, a further problem arose in soldering the casing leads onto the printed circuit, especially by dip soldering techniques. Excess solder flux would flow through the mounting holes in the board up to and beneath the component, possibly short-circuiting electrical leads or terminals.

It is accordingly an object of the invention to provide a component casing, which is of simple structure so as to render inexpensive not only its original manufacture, but also its further manipulation in connection with the assemblage of casing and component and with integrating the assemblage in an electric circuit.

Another object of the invention is provision of a component casing that may be used for mounting on terminal boards or printed circuit boards as desired.

A still further object of the invention is provision of an improved electrical component assemblage which may be mounted on a printed circuit board in a manner permitting removal of excess solder flux so as to avoid the possibility of electrical malfunctioning.

A specific object of the invention is to provide an improved pulse transformer mounting assemblage.

A still further object of the invention is provision of suitable method for carrying out the aforegoing objects and others apparent from the subsequent description.

Briefly stated, in accordance with the invention, the electrical component assemblage casing comprises the component receptacle proper and a plurality of electrical leads to which the electrical leads of the component may be connected as by soldering. The component receptacle is composed of an insulating material and is constructed as a unitary molded structure having a plurality of members that are integral with one another. The members include a base member, and intermediate member atop the base member, and preferably a flange-like rim member surrounding and upstanding of the intermediate member. The intermediate member is provided with an aperture located above the base member and has one or more parts that extend laterally outwardly of respective edges of the base member. The electrical leads pass through the outwardly extending parts of the intermediate member and are located in inwardly spaced relation to the rim member and outwardly spaced relation to the base member.

Although not limited thereto, the present invention is especially directed to components of miniature and subminiature size, and will be described by way of example only, with reference to small size inductive components, as for example pulse transformers.

For an appreciation of the advantages that flow from the casing configuration, and of other objects and novel features of the invention, reference is made to the following more detailed description, of which the appended claims form a part, when considered together with the accompanying drawing, in which:

Figure 1:
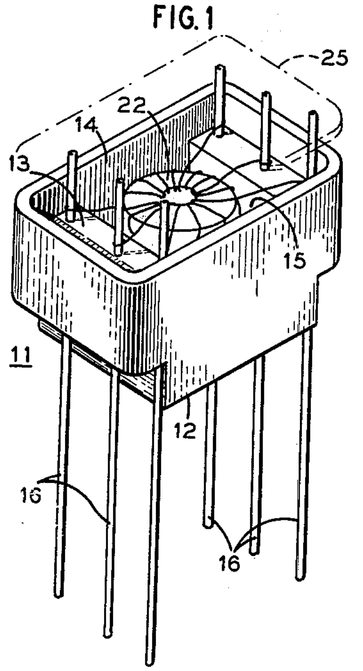
FIG. 1 is a perspective view of an electrical component assemblage in accordance with a preferred embodiment of the invention as applied to encasing a pulse transformer.
Figure 3:
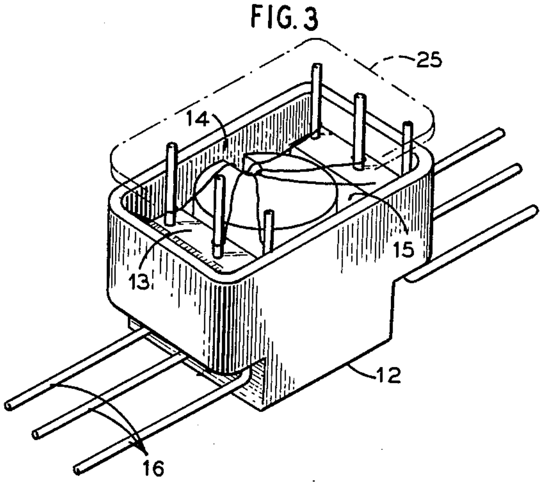
Figures 2, 4:
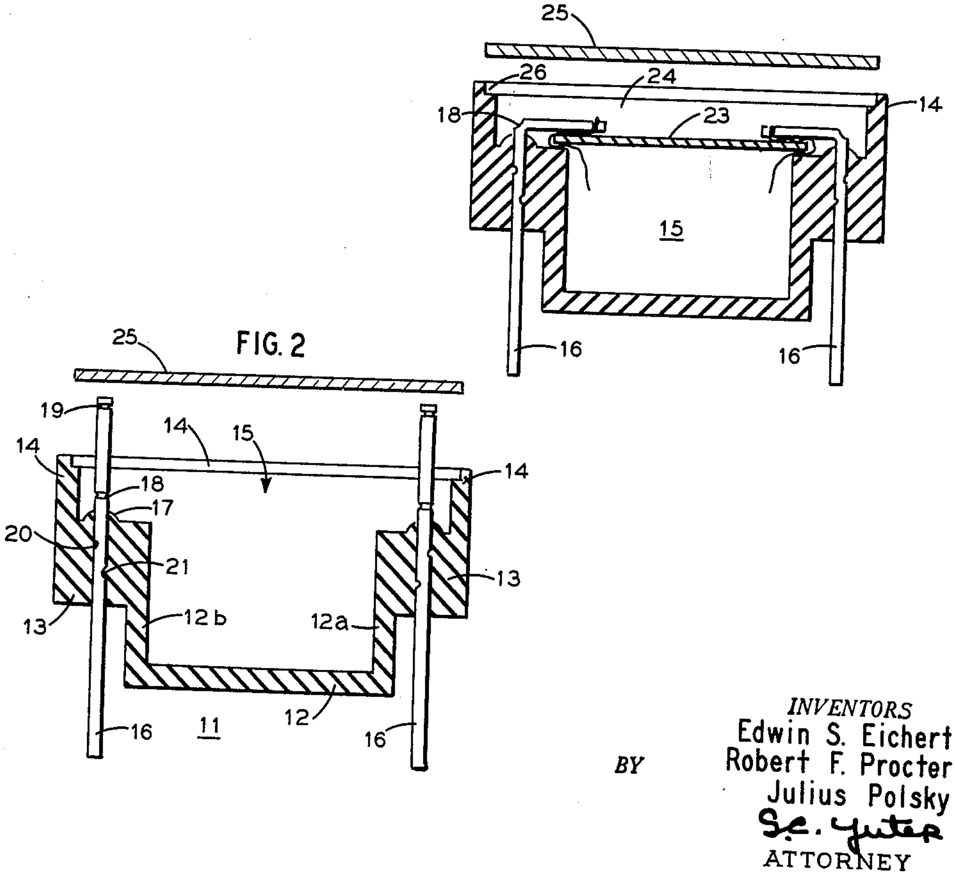
FIG. 2 is an elevational view taken along a central longitudinal section of the casing of FIG. 1, and includes several optional additional features omitted in FIG. 1.

FIG. 3 is a perspective view of an electrical component assemblage similar to that shown in FIG. 1, but arranged for mounting on a terminal board; and FIG. 4 is an elevational view taken along a central longitudinal section of the casing of FIG. 1 and shows cover means for covering the opening in which the electrical component is positioned, and includes the optional additional features shown in FIG. 2.

Referring to FIGS. 1 and 2, the therein illustrated electrical component assemblage includes the component receptacle 11 proper and a plurality of electrical leads 16. Receptacle 11 is composed of a molded insulating material, such as epoxy or phenol for example, and is constructed in a plurality of members that are integrally formed with one another. The members are base member 12 having side walls 12*a* and 12*b*, intermediate member 13 located atop the base member 12, and formed in a pair of parallel block-like banks having longitudinal extension in the width direction of the receptacle, and a flange-like, shell-like rim member 14 which is contiguous with the outer surfaces of, and upstands from the intermediate member 13. The component receptacle 11 and its several constituent members are of generally rectangular outline in each of the three dimensions but each may be of any other suitable shape; for example, circular. As illustrated, the front and rear surfaces are monoplanar, although this is not essential. However, the banks of intermediate member 13 are shouldered on the sidewalls 12*a* and 12*b* of the base member 12 so as to extend laterally outwardly thereof.

The banks of intermediate member 13 with side walls 12*a* and 12*b* form sidewalls, the rim member 14 and contiguous side walls of the base member 12 form front and rear walls, and the bottom portion of the base member 12 forms the bottom wall of a socket 15 which receives the component, here shown as a toroidal pulse transformer 22.

Any reasonable number of electrical leads 16 may be provided. As shown in FIG. 2, the electrical leads 16, here six in number, extend in the vertical direction through the banks of intermediate member 13, three through each bank, being positioned in the respective bank during and by virtue of the molding operation. Thus, the electrical leads 16 are fixedly embedded in the banks of intermediate member 13, in the illustrated case, by being in substantially continuous contact with the molded insulated material of the banks, to avoid subsequent loosening. To assure rigidity, the banks are preferably formed with mounds 17 at the upper points of emergence of the leads 16. Moreover the leads are preferably notched interiorly of the banks as at 20 and 21. The electrical leads 16 are preferably made of flexible conductors, for reasons more apparent from the subsequent description, and are preferably necked above mounds 17 as at 18, and also towards their upper ends as at 19. The socket 15 need not be partially formed by the rim-member 14; instead, a pair of additional, but longitudinally extending banks may be provided.

An important feature of the invention resides in the disposition of the electrical leads 16 which are located in outwardly spaced relation to the base member 12 and inwardly spaced relation to the rim member 14.

The component casing may be manufactured according to the following method:

The casing is made using standard transfer molding techniques. The leads 16 are inserted into a hot multipiece mold which is then clamped between two heater plates in a transfer molding press. The molding compound is then injected under pressure and heat into the mold, where it cures. The mold is removed from the press and then opened, at which time the cured casing or casings are ejected.

The component receptacle and pulse transformer or other component may be assembled in the following manner:

The pulse transformer 22 is inserted in the socket 15. The pulse transformer leads are wrapped around the casing leads 16 anywhere above the banks of the intermediate member 13, but most preferably at the necks 19 (FIG. 2) for the purpose of dip-soldering. Since dip soldering requires inversion of the casing assembly, the pulse transformer 22 is temporarily anchored to the base member 12 by applying a small quantity of rapid curing electrical cement to the base member 12 prior to the insertion of the transformer 22 into socket 15.

The electrical leads of the casing and pulse transformer 22 are next soldered together. A low dielectric constant material is inserted in socket 15. This step may also be performed prior to the soldering operation. If desired, a suitable cover 23 of FIG. 4, may be placed atop the pulse transformer 22 at this stage or following the next step, so that the potting compound ultimately to be poured into the chamber defined by the rim member 14 does not affect the distributed capacitance of the pulse transformer. Next, the electrical leads 16 are bent downwardly and inwardly about the necks 18 to approximately horizontal disposition as shown in FIG. 4. Next, the potting compound is poured into the interior of the component receptacle 11 to fill the space 24 substantially completely.

At this point a cap 25 may be positioned in an inner groove 26 of rim member 14 and secured to the casing by means of the potting compound. When cap 25 is not used, the potting compound is poured with a positive meniscus, and sanded down to a flat surface after the compound has cured.

The assembly is now ready for physical integration in an electric circuit. For mounting on a terminal board, the electrical leads 16 are bent to horizontal disposition as shown in FIG. 3. By way of variation, the component in FIG. 3 is a pulse transformer with cup core. The ends of the leads 16 are wrapped around the terminal board lugs and then soldered.

For mounting on a printed circuit board, the component receptacle is placed atop the board, and the electrical leads 16 are inserted in their mounting holes and soldered into the circuit, by dip-soldering if desired. Owing to the spatial separation of the leads 16 from the base member 12, it is possible to remove excess solder flux with flux remover, and avoid short-circuiting of the leads, thereby obviating a difficulty of prior art component casing assemblies.

The selection of the electrical leads 16 to be of flexible type results in a number of advantages. It permits excess top lead length to be bent over and covered with potting compound after the electrical connections are completed, as previously described, by dip-soldering techniques. It permits the same casing structural configuration to be used for terminal board mounting, printed circuit board mounting, or even chassis mounting if desired. In connection with printed circuit board mounting, the flexibility of the leads avoids any problem of registration of leads and connecting terminal mounting holes.

Thus it will be seen that a component casing and electrical component assemblage in accordance with the invention possess a number of advantages over comparable prior art devices, among which are versatility in use, ease in manufacture, ease of assembly, small number of parts, and as a concomitant, low cost in manufacture and assembly.

While a principal embodiment of the invention has been described and several modifications have been indicated, it should be understood that the invention is not limited to the structural configurations herein described, as further modifications may occur to those skilled in the art, and it is intended that such further modifications that do not essentially depart from the spirit and scope of the appended claims be embraced as within the invention.

What is claimed is:

1. A casing for fully enclosing an electrical component having leads comprising a component receptacle composed of an insulating material and constructed as a unitary molded structure having a plurality of members that are integral with one another, said members including a base member and a superposed member atop said base member having an aperture located above said base member which, with said base member, forms a socket adapted to receive and support the component, said superposed member having a part extending laterally outwardly of an outer edge of said base member, said casing further comprising a plurality of flexible electrical leads that are fixedly embedded in said unitary molded structure and are spaced from one another and pass through said outwardly extending part generally in the vertical direction in inwardly spaced relation to an outer edge of said superposed member and outwardly spaced relation to an outer edge of said base member, each lead of said plurality of flexible electrical leads having its intermediate portion fixedly embedded in said outwardly extending part with the top end portion extending upwardly of the upper surface of said outwardly extending part and the bottom end portion extending downwardly of the lower surface of said outwardly extending part, said plurality of flexible electrical leads being adapted to connect to the leads of an electrical component supported within said socket.

2. The casing of claim 1 wherein said bottom end portion of each of said flexible electrical leads extends past the lower surface of said base member.

3. The casing of claim 2 wherein said bottom end portion of each of said flexible electrical leads has a length which is sufficient when said bottom end portion is bent to extend past said outside edge of said outwardly extending part of said superposed member.

4. The casing of claim 3 further comprising a flange-like rim member upstanding from said superposed member.

5. The casing of claim 4 wherein each of said flexible electrical leads is necked just above the upper surface of said superposed member to facilitate the bending of each of said flexible electrical leads over said socket and beneath the upper surface of said rim member.

6. The casing of claim 1 wherein said bottom end portion of each of said flexible electrical leads has a length which is sufficient when said bottom end portion is bent to extend past said outside edge of said outwardly extending part of said superposed member.

7. The casing of claim 6 wherein said laterally extending part is located above the bottom of said base member a distance to provide sufficient clearance to enable said bottom end portion of each of said flexible electrical leads to be bent over so as to extend laterally when desirable or necessary for connecting to external circuits.

8. An electrical component assemblage comprising the casing of claim 1 and including an electrical component supported in said socket and means connecting said electrical component to said plurality of flexible electrical leads.

9. A component assemblage comprising a component receptacle composed of a molded insulating material and constructed as a unitary structure having a plurality of members that are completely integral with one another, said members including a base member, an intermediate member atop said base member having an aperture located above said base member which forms a socket and a flange-like rim member upstanding from the intermediate member, an electrical component permanently supported in said socket, said intermediate member having a part extending laterally outwardly of an edge of said base member, a plurality of flexible electrical leads spaced from one another and passing through said outwardly extending part generally parallel to the inner walls of said socket and fixedly secured in said unitary molded structure and extending from the upper and lower surfaces of said outwardly extending part in inwardly spaced relation to said rim member and outwardly spaced relation to said base member, the lower portion of each of said flexible electrical leads having a length sufficient to extend past the lower surface of said base member, and means electrically connecting said electrical component the upper portions of said plurality of electrical leads.

10. The component assemblage of claim 9 wherein said electrical component is permanently encapsulated wholly within said socket with portions of said electrical leads bent over said socket.

11. The component assemblage of claim 10 including a cover over said socket and wherein said electrical leads have necked sections immediately above mounds on said outwardly extended part and are bent over said cover at said necked sections.

12. A casing for an electrical component having leads comprising a receptacle composed of an insulating material and constructed as a unitary molded structure having a plurality of members that are integral with one another, said members including a base member, an intermediate member atop said base member formed in a pair of block-like banks which are spaced from one another so as to form a socket for receiving and supporting the component, the upper surface of the base member forming the bottom wall for the socket for supporting the component, at least one of the latter two banks being shouldered on said base member so as to extend laterally outwardly thereof in the length direction of the receptacle, and a shell-like, flange-like rim member contiguous with the outer surfaces of, and upstanding of said banks and forming a pair of sidewalls, a plurality of flexible electrical leads adapted to be connected to the leads of the component and spaced from one another and extending upwardly from the upper surface and downwardly of the lower surface of said shouldered bank generally in the vertical direction and being permanently embedded therein and extending in inwardly spaced relation to said rim member and in outwardly spaced relation to said base member, and a plurality of mounds on the upper surface of said shouldered bank each surrounding a flexible electrical lead as it exits from said shouldered bank, each of said flexible electrical leads being necked just above each mound to facilitate the bending of said flexible electrical lead over said socket and beneath the plane of the upper edge of said rim member, the lower surface of said shouldered bank being displaced from said base member to facilitate the bending of said flexible electrical leads outwardly from said base member and above the plane of the bottom surface of said base member.

13. An encapsulated electrical component assemblage comprising the casing of claim 12 and including an electrical component supported within said socket, a cover positioned over said socket and beneath the bent portions of said plurality of flexible electrical leads, means connecting said electrical component to said plurality of flexible electrical leads, and an insulating potting compound within said casing.

14. An electrical component assemblage comprising the casing of claim 12 wherein the lower portion of each of said flexible electrical leads extends past the lower surface of said base member and has a length sufficient when laterally bent to extend past the outer surface of said shouldered bank, an electrical component supported within said socket and means connecting said electrical component to said plurality of flexible electrical wires.

References Cited by the Examiner

UNITED STATES PATENTS

| | | | |
|---|---|---|---|
| 2,250,174 | 7/41 | Miller | 174—50.6 X |
| 2,263,396 | 11/41 | Power | 174—59 |
| 2,695,856 | 11/54 | Firth | 174—52 X |
| 3,041,504 | 6/62 | Lacan | 339—17 X |
| 3,046,452 | 7/62 | Gellert | 174—52 |
| 3,054,024 | 9/62 | Van Dillen et al. | 317—101 |
| 3,061,762 | 10/62 | Schlegel | 174—52 X |

FOREIGN PATENTS

| | | |
|---|---|---|
| 1,233,139 | 5/60 | France. |

JOHN F. BURNS, *Primary Examiner.*

BENNETT G. MILLER, JOHN P. WILDMAN, *Examiners.*